(12) United States Patent
Ganguli et al.

(10) Patent No.: US 9,048,183 B2
(45) Date of Patent: Jun. 2, 2015

(54) NMOS METAL GATE MATERIALS, MANUFACTURING METHODS, AND EQUIPMENT USING CVD AND ALD PROCESSES WITH METAL BASED PRECURSORS

(71) Applicant: Applied Materials, Inc., Santa Clara, CA (US)

(72) Inventors: Seshadri Ganguli, Sunnyvale, CA (US); Srinivas Gandikota, Santa Clara, CA (US); Yu Lei, Belmont, CA (US); Xinliang Lu, Fremont, CA (US); Sang Ho Yu, Cupertino, CA (US); Hoon Kim, Santa Clara, CA (US); Paul F. Ma, Santa Clara, CA (US); Mei Chang, Saratoga, CA (US); Maitreyee Mahajani, Saratoga, CA (US); Patricia M. Liu, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/147,291

(22) Filed: Jan. 3, 2014

(65) Prior Publication Data

US 2014/0120712 A1 May 1, 2014

Related U.S. Application Data

(63) Continuation of application No. 13/093,710, filed on Apr. 25, 2011, now Pat. No. 8,642,468.

(60) Provisional application No. 61/327,995, filed on Apr. 26, 2010.

(51) Int. Cl.
*H01L 21/3205* (2006.01)
*H01L 21/28* (2006.01)
(Continued)

(52) U.S. Cl.
CPC .......... *H01L 21/28008* (2013.01); *C23C 16/06* (2013.01); *C23C 16/32* (2013.01);
(Continued)

(58) Field of Classification Search
None
See application file for complete search history.

(56) References Cited

U.S. PATENT DOCUMENTS 5,055,280 A 10/1991 Nakatani et al.
6,139,922 A 10/2000 Kaloyeros et al.
(Continued)

FOREIGN PATENT DOCUMENTS

KR 20030009093 A 1/2003

OTHER PUBLICATIONS

International Search Report PCT/US2011/033820 dated Jan. 5, 2012.
(Continued)

*Primary Examiner* — Yasser A Abdelaziez
(74) *Attorney, Agent, or Firm* — Patterson & Sheridan, LLP

(57) ABSTRACT

Embodiments provide methods for depositing metal-containing materials. The methods include deposition processes that form metal, metal carbide, metal silicide, metal nitride, and metal carbide derivatives by a vapor deposition process, including thermal decomposition, CVD, pulsed-CVD, or ALD. A method for processing a substrate is provided which includes depositing a dielectric material forming a feature definition in the dielectric material, depositing a work function material conformally on the sidewalls and bottom of the feature definition, and depositing a metal gate fill material on the work function material to fill the feature definition, wherein the work function material is deposited by reacting at least one metal-halide precursor having the formula $MX_y$, wherein M is tantalum, hafnium, titanium, and lanthanum, X is a halide selected from the group of fluorine, chlorine, bromine, or iodine, and y is from 3 to 5.

18 Claims, 4 Drawing Sheets

(51) Int. Cl.

| | |
|---|---|
| *C23C 16/06* | (2006.01) |
| *C23C 16/32* | (2006.01) |
| *C23C 16/42* | (2006.01) |
| *C23C 16/455* | (2006.01) |
| *H01L 21/285* | (2006.01) |
| *H01L 21/768* | (2006.01) |
| *H01L 21/8238* | (2006.01) |
| *H01L 29/49* | (2006.01) |

(52) U.S. Cl.
 CPC .......... *C23C 16/42* (2013.01); *C23C 16/45542* (2013.01); *H01L 21/28079* (2013.01); *H01L 21/28088* (2013.01); *H01L 21/28097* (2013.01); *H01L 21/28562* (2013.01); *H01L 21/76843* (2013.01); *H01L 21/76871* (2013.01); *H01L 21/823814* (2013.01); *H01L 21/823842* (2013.01); *H01L 29/495* (2013.01); *H01L 29/4966* (2013.01)

(56) References Cited

U.S. PATENT DOCUMENTS

| | | | |
|---|---|---|---|
| 6,346,741 | B1 | 2/2002 | Van Buskirk et al. |
| 6,815,285 | B2 | 11/2004 | Choi et al. |
| 6,876,078 | B2 | 4/2005 | Kim et al. |
| 7,067,420 | B2 | 6/2006 | Choi et al. |
| 7,081,409 | B2 | 7/2006 | Kang et al. |
| 7,098,131 | B2 | 8/2006 | Kang et al. |
| 7,105,444 | B2 | 9/2006 | Choi et al. |
| 7,148,100 | B2 | 12/2006 | Kim et al. |
| 7,148,548 | B2 | 12/2006 | Doczy et al. |
| 7,244,645 | B2 | 7/2007 | Kim et al. |
| 7,452,811 | B2 | 11/2008 | Choi et al. |
| 7,514,346 | B2 | 4/2009 | Chau et al. |
| 7,563,701 | B2 | 7/2009 | Chang et al. |
| 7,833,855 | B2 | 11/2010 | Kang et al. |
| 2004/0208994 | A1* | 10/2004 | Harkonen et al. ......... 427/249.1 |
| 2004/0259303 | A1 | 12/2004 | Lee et al. |
| 2005/0009325 | A1 | 1/2005 | Chung et al. |
| 2006/0240665 | A1 | 10/2006 | Kang et al. |
| 2007/0001238 | A1 | 1/2007 | Koyama et al. |
| 2009/0035946 | A1 | 2/2009 | Pierreux et al. |
| 2009/0078916 | A1 | 3/2009 | Shah et al. |
| 2009/0081868 | A1 | 3/2009 | Shah et al. |
| 2009/0149012 | A1 | 6/2009 | Brask et al. |
| 2010/0062149 | A1 | 3/2010 | Ma et al. |
| 2010/0062614 | A1 | 3/2010 | Ma et al. |
| 2010/0129535 | A1 | 5/2010 | Shah et al. |
| 2011/0081774 | A1 | 4/2011 | Yeh et al. |
| 2011/0115023 | A1 | 5/2011 | Cheng et al. |

OTHER PUBLICATIONS

Robert S. Chau "Integrated CMOS Tri-Gate Transistors: Paving the Way to Future Technology Generations," Technology@Intel Magazine, pp. 1-7, Aug. 2006.

* cited by examiner

NMOS METAL GATE MATERIALS, MANUFACTURING METHODS, AND EQUIPMENT USING CVD AND ALD PROCESSES WITH METAL BASED PRECURSORS

CROSS-REFERENCE TO RELATED APPLICATIONS

This application is a continuation of co-pending U.S. patent application Ser. No. 13/093,710, filed Apr. 25, 2011, which claims benefit of U.S. provisional patent application Ser. No. 61/327,995, filed Apr. 26, 2010. Each of the aforementioned patent applications is herein incorporated by reference.

BACKGROUND OF THE INVENTION

1. Field of the Invention

Embodiments of the invention generally relate to electronic device processing, and more particularly, to vapor deposition processes for metal-containing materials and the compositions of the metal-containing materials.

2. Description of the Related Art

The electronic device industry and the semiconductor industry continue to strive for larger production yields while increasing the uniformity of layers deposited on substrates having increasingly larger surface areas. These same factors in combination with new materials also provide higher integration of circuits per unit area on the substrate. As circuit integration increases, the need for greater uniformity and process control regarding layer characteristics rises.

Several areas of fabrication that are constantly improving include the formation of metal gate electrodes and the deposition of contact barrier layers. Gate electrodes have often been made with silicon based materials, but more frequently are made with metallic materials, such as tungsten or cobalt. However, the materials used for gate electrodes have had less than desirable electronic properties. While tantalum materials have been used in semiconductor structures, such as barrier layers, tantalum materials have only been scarcely used for the formation of metal gate electrodes, despite the variety of electronic characteristics available from tantalum materials.

Gate materials layers formed from sputtered tantalum and reactive sputtered tantalum nitride have demonstrated suitable electronic properties. Exemplary properties include high conductivity, high thermal stability, and resistance to diffusion of foreign atoms. Physical vapor deposition (PVD) processes are used to deposit tantalum materials as gate electrodes or in features of small size (e.g., about 90 nm wide) and high aspect ratios of about 5:1.

Advancement in technologies for forming semiconductor structures will now require conformal deposition on the bottom and side walls for work function materials on high k dielectric materials and gate electrodes on work function materials as opposed to the traditionally bottom only deposition approach making PVD undesirable and many CVD processes producing less than desired results. Further, it is believed that PVD processes may have reached a limit at this size and aspect ratio. Also, the variety of compositions for tantalum materials is very limited when using a PVD process.

Attempts have been made to use traditional tantalum precursors found in chemical vapor deposition (CVD) or atomic layer deposition (ALD) processes to deposit tantalum materials. Multiple CVD and ALD processes are anticipated to be used in the next generation technology of 45 nm wide features having aspect ratios of about 10:1 or greater. Also, ALD processes more easily deposit tantalum materials on features containing undercuts than does PVD processes. Formation of tantalum-containing films from CVD or ALD processes using $TaCl_5$ as a precursor may require as many as three treatment cycles using various radial based chemistries (e.g., atomic hydrogen or atomic nitrogen) to form tantalum materials. Processes using $TaCl_5$ may also suffer from chlorine contaminants within the tantalum material. While metal-organic tantalum precursors may be used to form tantalum materials containing no chlorine contaminants, the deposited materials may suffer with the undesirable characteristic of a high carbon content. Other metal materials to be deposited for metal gate electrodes have experienced similar difficulties as the deposition of tantalum.

Therefore, there is a need for a process to deposit metal-containing materials on a substrate, including as a metal gate electrode as well as a barrier layer.

SUMMARY OF THE INVENTION

Embodiments of the invention generally provide methods for depositing a metal-containing material onto a substrate. The metal-containing materials may include tantalum, hafnium, titanium, and lanthanum-containing materials that may further be doped with nitrogen, carbon, silicon, and/or aluminum. The deposition process may include thermal decomposition processes, chemical vapor deposition (CVD) processes, pulsed CVD processes, atomic layer deposition (ALD) processes, as well as plasma enhanced (PE) processes, such as PE-CVD and PE-ALD.

In one embodiment, a method for processing a substrate includes depositing a dielectric material having a dielectric constant greater than 10, forming a feature definition in the dielectric material, depositing a work function material conformally on the sidewalls and bottom of the feature definition, and depositing a metal gate fill material on the work function material to fill the feature definition, wherein the work function material is deposited by reacting at least one metal-halide precursor having the formula $MX_y$, wherein M is tantalum, hafnium, titanium, and lanthanum, X is a halide selected from the group of fluorine, chlorine, bromine, or iodine, and y is from 3 to 5.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of the invention and are therefore not to be considered limiting of its scope, for the invention may admit to other equally effective embodiments.

DETAILED DESCRIPTION

Figure 1:
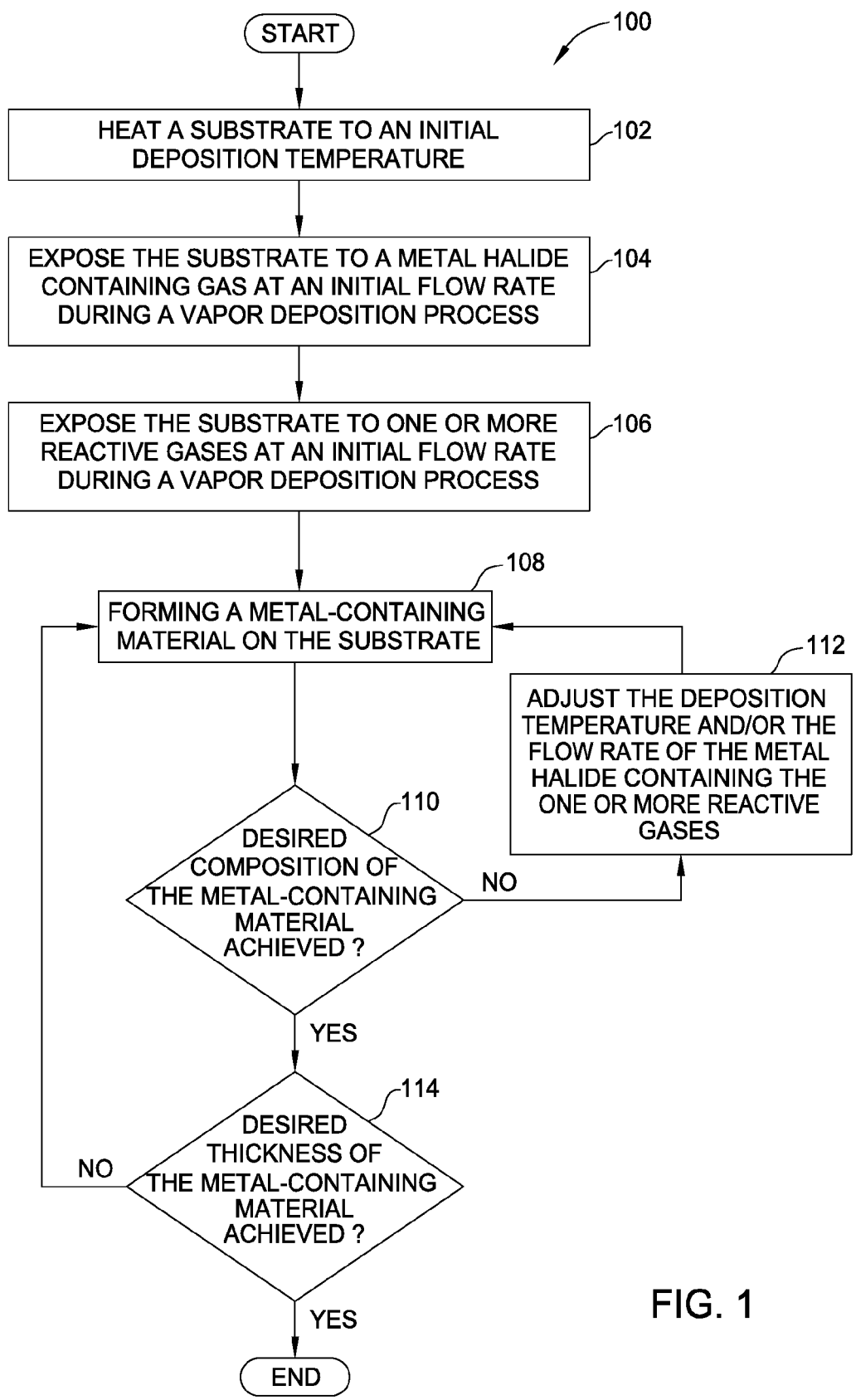
FIG. 1 illustrates a flow diagram showing a method of depositing a metal carbide material in accordance with embodiments described herein.

Embodiments of the invention provide for depositing a metal-containing material, such as metal, metal carbide ($MC_x$), metal silicide ($MSi_x$), metal carbide silicide ($MC_x$-$Si_y$), metal carbide nitride ($MC_xN_y$), or metal borides ($MB_x$) onto a substrate. The metal-containing materials may be used as a work function metal, and optionally a metal gate fill material, for a gate electrode structure. In particular, the metal, metal carbide, metal carbide silicide, and metal boride materials may be used as a NMOS material for a metal gate structure. Metal carbide nitride materials may be used as a PMOS material for a gate electrode structure. Generally, nitrogen containing materials, such as metal carbide nitrides, are desired for PMOS structures and not for NMOS structures.

In one embodiment, the metal-containing material described herein may be used in a metal gate structure. For example, FIG. 3B depicts a semiconductor structure, which may be used in a Logic application, having a metal-containing gate electrode 350 containing a metal, metal carbide, or metal carbide silicide material deposited by methods described herein.

An initial feature definition 355 is formed in a high k dielectric material 360, i.e. a dielectric constant of greater than 10, that was previously deposited on the substrate. Suitable high k dielectric materials include a dielectric material having a dielectric constant of 25 or greater. One class of high k dielectric material 360 that may be used include one or more oxide materials. Examples of suitable oxide materials include hafnium oxide, hafnium silicate, hafnium silicon oxynitride, aluminates thereof, or derivatives thereof or combinations thereof. Other oxide materials include lanthanum oxide, lanthanum silicate, zirconium oxide, zirconium silicate, or combinations thereof. Each of the one or more oxide materials may also be doped with a material selected from the group of zirconium, lanthanum, cerium, titanium, or combinations thereof.

A work function material layer 370 is then conformally deposited in the feature definition formed in the high k dielectric material 360. The metal gate fill material 380 is then formed on the work function material layer 370 and fills the feature definition 355.

Work function is a material property, measured in electron volts (eV), which represents the amount of energy needed to remove an electron from a solid to a point outside the solid surface or the energy needed to move an electron from the Fermi level into a vacuum. In practice, the work function value is the amount of energy needed to move the metal electron from the metal to the high-k material. It is believed that the value is close to the ideal work function and may sometimes vary due to the structure of the metal that gets deposited on the dielectric material. For a metal, the work function is a constant, and for a semiconductor material, the work function can be modified by the addition of other materials, such as boron or phosphorus, generally considered dopant materials. A transistor's threshold voltage may be modified when using materials having different desired work functions in a metal gate electrode structure.

A work function material as detailed herein is a material having work function material properties and used to form the desired properties, such as electrical properties, of a gate electrode in a transistor structure. The work function material may be disposed on or adjacent to the high k dielectric material to provide the most effect of the work function material's properties on the metal gate electrode structure of a transistor. The work function required will depend on the high-k material and the doping type and amount of the source, drain, and gate. Thus, the composition of the work function metal may need to be varied to achieve the desired amount. The work function of N-metal planar gate structures should typically be equal to or less than 4.3 eV, whereas the work function for non-planar gate structures such as FinFET gate structures, where higher doping is acceptable, may be equal to or less than 4.4 eV. The work function for a given circuit design depends on the amount of doping allowed. The work function material layer 370 may comprise the metal-containing layers described herein, and may be deposited by the processes described herein.

The work function material may be a metal, metal carbide, metal silicide, metal carbide silicide, metal carbide nitride, or metal boride material described herein and deposited by the processes described herein. Additionally, the metal, metal carbide, metal silicide, metal carbide silicide, metal carbide nitride, or metal boride materials may contain other conductive materials, such as aluminum. Suitable work function materials include a material selected from the group of tantalum, hafnium, titanium, lanthanum, tantalum carbide, hafnium carbide, titanium carbide, lanthanum carbide, hafnium silicides, tantalum silicides, titanium silicides, lanthanum silicides, tantalum carbide silicide, hafnium carbide silicide, titanium carbide silicide, lanthanum carbide silicide, hafnium aluminide carbide, tantalum aluminide carbide, lanthanum aluminide carbide, tantalum carbide nitride, tantalum aluminide nitride, lanthanium boride, hafnium boride, or combinations thereof. Additionally, the work function material may be deposited, for example, to a thickness of about 20 Å or more, such as from about 20 Å to about 80 Å, for example, about 30 Å thick.

A metal gate fill material is used to complete the gate electrode 350 as shown in FIG. 3B. The work function material layer 370 and the metal gate fill material 380 may be the same or different material depending on the respective conductivity desired for the gate electrode 350. If a metal gate fill material is used that is different than the work function material, the metal gate fill material may include an electrically conductive material, such as a metal or a metal alloy. Examples of a metal or a metal alloy for use as a metal gate fill material include materials from the group of tungsten, aluminum, copper, cobalt, and combinations thereof, and alloys of tungsten, aluminum, copper, cobalt and combinations thereof.

If the metal gate fill material is used that is the same or substantially the same as the work function material, the metal gate fill material 380 may comprise the metal, metal carbide, metal carbide silicide, metal silicide, metal boride, or metal carbide nitride materials described herein and be deposited by the processes described herein. Alternatively, the work function material layer 370 and the metal gate fill material 380 may be different materials that are both selected from the metal, metal carbide, metal carbide silicide, or metal carbide nitride materials described herein. For example, the high dielectric constant material may be hafnium oxide, the work function material layer 370 may be hafnium carbide, and the gate fill material may be tantalum carbide. The gate fill material should have an equal or lesser resistivity than the work function material layer. Nitrogen containing materials, such as metal carbide nitrides, are desired for PMOS structures and not for NMOS structures, or for the gate electrode 350.

Optionally, a wetting layer may be deposited prior to the deposition of the metal gate fill material 380. The wetting layer may be a metal material selected from the group of cobalt, tantalum, titanium, and combinations thereof. Alternatively, a barrier layer, which may also be used in conjunction as a wetting layer or perform as a wetting layer, may be deposited before or after the work function material layer. The barrier layer may comprise any suitable barrier layer for the fill material, i.e., tungsten, copper, and aluminum, and may be a metal-containing material selected from the group of tantalum nitride, titanium nitride, tungsten nitride, and combinations thereof. A barrier layer deposited before the work function layer 370 is shown in layer 365 by broken lines. A barrier layer and/or a wetting layer deposited after the work function layer 370 but before the metal gate fill material 380 is shown in layer 375 by broken lines. Each of the barrier and/or wetting layers may be deposited to a thickness of 50 Å or less, such as from about 1 Å to about 20 Å.

The above described process may be used to form a complementary metal oxide semiconductor (CMOS) structure, and in particular to form a gate electrode or metal gate electrode layer for an n-doped portion of the CMOS (NMOS) structure or a p-doped portion of the CMOS (PMOS) structure involving the deposition of a high k layer, a capping layer, and a metal gate electrode layer, all of which layers may be deposited within the same processing chamber.

The metal-containing materials may be deposited by various deposition techniques, such as thermal decomposition, chemical vapor deposition (CVD), pulsed-chemical vapor deposition (CVD), plasma enhanced chemical vapor deposition (PE-CVD), remote plasma enhanced chemical vapor deposition (PE-CVD), atomic layer deposition (ALD), plasma enhanced atomic layer deposition (PE-ALD), or combinations thereof. FIG. 1 and the corresponding description are directed to a flow chart for an embodiment of a deposition process, and is not meant to be interpreted or construed as limiting the aspects of the invention described herein.

FIG. 1 illustrates a flow chart depicting processing in a method 100 that may be used to form a metal-containing layer. The metal-containing layer may be, for example, a metal, a metal carbide material, a metal silicide material, a metal carbide silicide material, or a metal carbide nitride material. During process 102, a substrate is heated to an initial deposition temperature within a process chamber. The substrate may be heated to a temperature within a range from about 100° C. to about 600° C., preferably, from about 100° C. to about 500° C., and more preferably, from about 150° C. to about 500° C. Suitable temperatures for deposition using metal halide precursors described herein may be from 100° C. to about 450° C., such as from about 150° C. to about 425° C.

One important precursor characteristic is to have a favorable vapor pressure. Deposition precursors may have gas, liquid or solid states at ambient temperature and pressure. However, within the process chamber, precursors may be volatilized as gas. The process chamber has a controlled environment that is pressurized within a range from about 1 mTorr to about 100 Torr, preferably, from about 1 Torr to about 10 Torr, and more preferably, from about 2 Torr to about 5 Torr. Precursors are usually heated prior to delivery into the process chamber, such as at a temperature from about room temperature to about 200° C.

The substrate is subsequently exposed to a metal halide precursor containing gas that has an initial flow rate at process 104. The metal-containing materials may be deposited by a reaction process of at least one (one or more) metal-halide precursor having the formula $MX_Y$, where M is a metal selected from the group of tantalum, hafnium, titanium, and lanthanum, X is a halide selected from the group of fluorine, chlorine, bromine, and iodide, and y is from 3 to 5. The metal halide precursors may be a fluorine-containing or chlorine-containing halide compound selected from the group consisting of tantalum pentachloride, tantalum pentafluoride, tantalum pentabromide, hafnium tetrachloride, lanthanum trichloride, and combinations thereof.

The substrate is also exposed to one or more reactive gases that have an initial flow rate at process 106. The reactive gas may include a single reactive gas or combinations of various reactive gases. In general, the reactive gas may react with the halide, bonds with it, and removes the halide from the deposited metal. In some embodiments, part of the reactive gas bonds with the metal and forms a metal compound, such as a metal carbide, metal silicide, metal carbide silicide, and metal carbide nitride. The reactive gas may also include a plasma treatment process that strips off the halide part and then reacts with the metal halide precursors to form the work function metal.

The reactive gas may be a nitrogen-free reactive gas. Alternatively, the reactive gas may include a reducing gas, which includes a nitrogen-containing gas (e.g. ammonia) for metal carbide nitride depositions. The reactive gas may further include an inert gas or an inert gas plasma/radicals. The nitrogen-free reactive gas may be a hydrogen based gas, a carbon-containing reactive gas, a silicon-containing reactive or reducing gas, or combinations thereof. The hydrogen based gas may include hydrogen gas or hydrogen gas plasma/hydrogen radicals, such as from a plasma or remote plasma.

The carbon-containing reactive gas may also be a carbon-containing reducing gas such as methane, ethylene, ethyne, propane, propene, propyne, butane, hexane, heptane, octane, nonane, decane, methane and acetylene plasmas/radicals, and combinations thereof, among others, which may be used for carbide depositions.

The silicon-containing reactive gas may be used for silicon-containing material depositions, such as silicides. Silicon-containing precursors include silanes and organosilanes. Silanes include silane ($SiH_4$) and higher silanes with the empirical formula $Si_xH_{(2x+2)}$, such as disilane ($Si_2H_6$), trisilane ($Si_3H_8$), and tetrasilane ($Si_4H_{10}$), as well as others. Organosilanes include compounds with the empirical formula $R_ySi_xH_{(2x+2-y)}$, where R is independently methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$), tris(dimethylamino)silane (TDMAS), and combinations thereof.

The reactive gas may further include aluminum based reactive compounds, for example trimethylaluminum (TMA, $Al_2Me_6$ or $(AlMe_3)_2$), triethylaluminum ($Al_2Et_6$, $(AlEt_3)_2$, or TEA), dimethylaluminum hydride (DMAH), tritertiarybutyl aluminium (TTBA), aluminum hydride ($AlH_3$), and combinations thereof. Additionally, the metal carbide and metal silicides compounds described below may be deposited with additional metal compound. Aluminum may be deposited with the metal-containing materials described herein by introducing an aluminum precursor, such as trimethylaluminum, triethylaluminum, triisobutyl aluminum, dimethyl aluminum hydride (DMAH), tritertbutyl aluminum, aluminum hydride, aluminum trichloride, and combinations thereof. A hydrogen based plasma may be used for including aluminum in the deposited materials. Deposited metal-containing materials including aluminum can include hafnium aluminum carbide, tantalum aluminum carbide, titanium aluminum carbide, and lanthanum aluminum carbide, among others.

The reactive gas may be a nitrogen-containing reducing gas for use in forming metal carbide nitrides, such as for PMOS structures. A nitrogen-containing reducing gas may be used to deposit metal-containing nitride materials, such as tantalum carbide nitride materials. A nitrogen-containing reducing gas or nitrogen precursor may include, ammonia ($NH_3$), hydrazine ($N_2H_4$), methyl hydrazine (($CH_3$)$HN_2H_2$), dimethyl hydrazine (($CH_3$)$_2N_2H_2$), t-butylhydrazine ($C_4H_9N_2H_3$), phenylhydrazine ($C_6H_5N_2H_3$), other hydrazine derivatives, amines including trimethyl amine, dimethylamine, and tritertbuylamine, a nitrogen plasma source (e.g., $N_2$, $N_2/H_2$, $NH_3$, or $N_2H_4$ plasmas), 2,2'-azotertbutane (($CH_3$)$_6$ $C_2N_2$), organic or alkyl azides, such as methylazide ($CH_3N_3$), ethylazide ($C_2H_5N_3$), trimethylsilylazide ($Me_3SiN_3$), inorganic azides (e.g., $NaN_3$ or $Cp_2CoN_3$), and other suitable nitrogen sources. Radical nitrogen compounds can be produced by heat, hot-wires and/or plasma, such as $N_3$, $N_2$, $N$, $NH$, or $NH_2$. In many examples, the nitrogen-containing gas contains ammonia.

Boron-containing compounds, or boron precursors, may be used to deposit metal-containing materials including boron, such as metal boride carbide nitride, metal boride nitride, metal boride carbide, or metal boride. Boron precursors include boranes and organoboranes, which include borane ($BH_3$), diborane ($B_2H_6$), triborane ($B_3H_8$), tetraborane ($B_4H_{10}$), trimethylborane (($CH_3$)$_3B$), triethylborane (($CH_3CH_2$)$_3B$), or derivatives thereof. Exemplary boron precursors include diborane and trimethylborane.

The reactive gas exposure may be considered a pre-treatment process, such as a soak process, if the substrate is exposed to the reactive gas for 10 or more seconds, such as from greater than 10 seconds to 60 seconds. If a soak pretreatment process is performed, preferred soak precursors are silane, diborane, and combinations thereof.

A carrier gas may also be combined with the metal halide containing gas or the reactive gases. A purge gas may also be used to purge the chamber in between or during deposition cycles. The carrier gas and purge gas may be argon, nitrogen, hydrogen, helium, forming gas ($N_2/H_2$), or combinations thereof, of which non-reactive nitrogen-free gases, such as helium and argon are preferred for NMOS deposition processes.

The metal-containing material is formed on the substrate while substrate is exposed to the metal halide containing gas and reactive gas during process 108 using any of deposition the techniques previously described. In process 108, the metal-containing material may be deposited on the substrate while the reactive gas is previously or is concurrently being exposed to the substrate. For use as a NMOS structure, metal, metal carbides, metal silicides, and metal carbide silicides are preferred with minimal or no halide content and also to be nitrogen-free. For a PMOS structure, nitrides are preferred with minimal or no halide content. Thus, the metals that may be deposited as part of the metal-containing material are tantalum, hafnium, titanium, and lanthanum. In some embodiments, the metal-containing material may also include aluminum along with the metal from the metal halide precursor. Various embodiments of the metal-containing materials are described below, including metal, metal carbide, metal silicide, metal carbide silicide, or metal carbide nitride materials.

In one embodiment, tantalum or tantalum carbide materials may be deposited by chemical vapor deposition or atomic layer deposition using a tantalum halide precursor and a reactive gas. Examples of such precursors include tantalum pentachloride ($TaCl_5$), tantalum pentafluoride ($TaF_5$), tantalum pentabromide ($TaBr_5$), or combinations thereof. The reactive gas for forming tantalum metal material may be a hydrogen reducing gas as described herein, including hydrogen gas plasma/radicals. The reactive gas for forming the tantalum carbide may be carbon-containing reactive gases include ethylene, methane, a mixture of ethylene and methane, and including plasmas/radicals of the reactive gases for carbide depositions.

In another embodiment, tantalum silicide material may be deposited by exposing a substrate to a process gas that includes a tantalum precursor gas and a silicon-containing reactive gas, such as those previously described. The tantalum silicide material may further include a carbon-containing reactive gas, such as those described above, for depositing a tantalum carbide silicide material. In such an embodiment, the tantalum precursor and the silane precursor are first reacted, and then exposed to the carbon-containing precursor. For a $TaSi_x$ film used as an N-metal work function, the Ta/Si ratio may be around 2.00.

In one example of the deposition process, tantalum pentafluoride is introduced into a processing chamber to form a monolayer on the substrate, and then the deposited material is exposed to a plasma of a reducing gas, such as a plasma of hydrogen gas, to remove halide containing compounds from the monolayer. The reducing gas may be formed either in the chamber or by a remote plasma generation. The exposed material of tantalum metal with a reduced halide content can then be further exposed to a carbon-containing material, such as ethylene, to form a tantalum carbide, and/or a silicon-containing material, such as silane to form a tantalum silicide or a tantalum carbide silicide. For use in NMOS structures, a higher carbon content in a tantalum carbide is desired.

In one embodiment, tantalum metal may be deposited to provide for a desired work function value and be suitable for later dopant. Tantalum pentafluoride ($TaF_5$) can be used to deposit a tantalum metal layer having a work function of about 4.2 and have less than about 3 atomic percent (at. %) of halide atoms, such as from about 1 atomic percent to less than about 3 atomic percent. The fluorine content of the deposited tantalum layer can be achieved to less than about 3 atomic percent range by using hydrogen gas or aluminum reducing agents as described herein during the deposition process or as part of a post-deposition treatment, which treatment may be a plasma treatment.

In another example of the deposition process, tantalum pentachloride ($TaCl_5$) is introduced into a processing chamber to form a monolayer on the substrate, and then the deposited material is exposed to a plasma of a reducing gas, such as a hydrogen. The plasma may be formed either in the chamber or by a remote plasma generation. The exposed material of tantalum metal with a reduced halide content can then be further exposed as necessary, such as to a silicon-containing material to form a silicide if desired, or a carbon-containing precursor, such as ethylene, to increase the carbon content of the deposited material.

In one embodiment, tantalum carbide can be deposited by a process of exposing the substrate to tantalum pentachloride ($TaCl_5$) and ethylene gas at 550° C. If desired, a hydrogen plasma may also be used after the ethylene gas exposure during the cycle. The hydrogen plasma helps to reduce the carbon content in the film. Such a processing temperature allows for effective integration in a multi-layer deposition process that may have temperature limits based on the respective materials used. For N-metal work function when formed with TaC, the Ta/C ratio may be around 1.00.

In another embodiment, a hafnium metal or a hafnium carbide material may be deposited by exposing a substrate to a process gas that includes a hafnium precursor gas and a reactive gas. An example of such a hafnium halide precursor is hafnium tetrachloride ($HfCl_4$). Reactive gases may include hydrogen gas and/or a carbon-containing reactive gas for a hafnium carbide. The reactive gas may further include a silicon-containing gas, such as silanes and organosilanes as previously described, for producing silicides of the hafnium materials described herein. For example, for a hafnium carbide silicon material deposition, the hafnium precursor may be exposed to a silicon-containing compound, and then reacted with a carbon-containing compound.

In one example of the deposition process, hafnium tetrachloride ($HfCl_4$) is introduced into a processing chamber to form a monolayer on the substrate, and then the deposited material is exposed to a plasma of a reducing gas, such as a hydrogen. The plasma may be formed either in the chamber or by a remote plasma generation. The exposed material of hafnium metal with a reduced halide content can then be further exposed as necessary, such as to a silicon-containing material to form a silicide if desired, or a carbon-containing precursor, such as ethylene, to increase the carbon content of the deposited material.

In another embodiment, a lanthanum metal or lanthanum carbide material may be deposited by exposing a substrate to a process gas that includes a lanthanum precursor gas and a reactive gas. An example of such a lanthanum halide precursor is lanthanum trichloride ($LaCl_3$). Reactive gases may include hydrogen gas, including hydrogen plasma/radicals for lanthanum and/or a carbon-containing reactive gas for a lanthanum carbide material or boron-containing reactive gas for a lanthanum boride material.

The reactive gas may further include a silicon-containing gas as described herein for producing lanthanum silicide material by exposing a substrate to a process gas that includes the lanthanum precursor gas and a silicon-containing reactive gas, such as those previously described. The process gas for depositing the lanthanum silicide material may further include a carbon-containing reactive gas, such as those previously described, for depositing a lanthanum carbide silicide material. For example, for a lanthanum carbide silicon material deposition, the lanthanum precursor may be exposed to the silicon-containing compounds, and then reacted with the carbon-containing compound.

In another embodiment, a titanium metal or titanium carbide material may be deposited by exposing a substrate to a process gas that includes a titanium precursor gas and a reactive gas. An example of such a titanium halide precursor is titanium tetrachloride ($TiCl_4$) and titanium tetrafluoride ($TiF_4$). The reactive gas for forming titanium metal material may be a hydrogen reducing gas as described herein, including hydrogen gas plasma/radicals. The reactive gas for forming the titanium carbide may be carbon-containing reactive gases, as described herein.

In another embodiment, titanium silicide material may be deposited by exposing a substrate to a process gas that includes a titanium precursor gas and a silicon-containing reactive gas, such as those previously described. The titanium silicide material may further include a carbon-containing reactive gas, such as those described above, for depositing a titanium carbide silicide material. In such an embodiment, the titanium precursor and the silane precursor are first reacted, and then exposed to the carbon-containing precursor.

In addition to the embodiments described in particular above, the reactive gases described herein for depositing metal-containing materials within the deposition process during process 106, may be deposited with additional materials and reactive gases. In other embodiments, the metal-containing materials may contain silicon, aluminum, phosphorous, hydrogen, and other elements, in addition to or as a substitute to carbon and/or nitrogen.

A plasma treatment, such as hydrogen plasma treatment may also be used to reduce or minimize the halide atomic percent concentration, such as less than 3 atomic percent, deposited in a metal or metal carbide film using a metal halide precursor. The halide concentration may be from about 0.5 to less than 3 atomic percent halide atoms following a plasma treatment. The plasma treatment may be one of the plasma gas processes as described herein for the deposition processing sequences.

The metal, metal carbides, metal silicides, metal carbide silicides, and metal carbide nitrides described above for tantalum, lanthanum, titanium, and hafnium may also be deposited by reaction with aluminum based reactive compounds. An aluminum reactive gas allows for the removal of halide atoms from a metal-halide precursor deposited material, such as $TiCl_4$ and $TaCl_5$ deposited material, as an alternative to the plasma treatment process. The aluminum reactive gas reacts with chlorine atoms to form alkyl aluminum chlorides, which are then removed. It has been observed that the aluminum reactive gas with the halide metal precursors allows the deposition of material layers having less than about 7 atomic percent (at. %) halide atoms, such as less than about 4 at. %. For example, it has been observed that a tantalum layer deposited from tantalum pentafluoride can have the halide concentration of the deposited material be reduced to less than 3 atomic percent fluorine atoms by using a triethylaluminum (TEA). The halide concentration may be from 0.5 to 4 atomic percent halide atoms when reacting with an aluminum precursor.

Alternatively, aluminum based reducing agents may provide for aluminum to be introduced into the deposited material for metal and metal carbide deposition processes. For example, the aluminum reactive gases may be used to form hafnium aluminide (HfAl), tantalum aluminide (TaAl), hafnium aluminide carbide ($HfAlC_x$), or tantalum aluminide carbide ($TaAlC_x$) for use as an NMOS material and can provide up to 30 atomic percent, such as from about 10 atomic percent to about 30 atomic percent, carbon content/impurity in the deposited materials.

Multi-metal compounds such as tantalum aluminide (TaAl) and other described herein may also be considered as metal alloys. Multi-metal compounds with additional compounds, such as a carbon and silicon, may also be considered as metal alloy with the carbon or silicon bonded to the one or more of the alloy's metal atoms to form metal carbide or metal silicides, for example. For example, tantalum aluminide carbide ($TaAlC_x$) may be considered as tantalum carbide with aluminum disposed therein. The aluminum can be considered impurities for some material deposition processes.

Process 108 may include various process sequences, such as chemical vapor deposition co-flow or sequential flow. Repeating such sequential flow cycles for minimal durations will result in an atomic layer deposition repeating cycle.

For a thermal decomposition process, the metal halide precursor (and any carrier gases) and any reactive gases can be individually flowed or co-flowed into the processing chamber as necessary. Thermal decomposition processes may be performed at temperatures from about 100° C. to about 600° C. For chemical vapor deposition process, the metal precursor (and any carrier gases) and any reactive gases can be co-flowed into the processing chamber.

In one embodiment, a sequential flow process comprises a two compound flow process. The two compound flow process includes a first compound, such as the metal halide precursor and any accompanying carrier gases, and a second compound, such as a reactive gas described herein. Additional reactive compounds such as dual reducing gases, such as a carbon-containing gas and a silicon-containing gas, may be introduced concurrently or sequentially with an optional purge gas there between. In the following processes describing a plasma process, the plasma gas may be a hydrogen gas, a mixture of hydrogen gas and silane gas, or a mixture of hydrogen gas and ethylene gas. The plasma is struck in the presence of the plasma process and carrier gases, and, optionally, the metal halide precursor gas, although, it is unlikely that plasma processing will include any substantial amount of metal precursor gas in an atomic layer deposition process. The plasma may also be formed within the chamber or the plasma may be generated by a remote plasma source of the plasma gas.

Prior to the process sequences described herein, the substrate surface may be pre-treated or "soaked" with a reactive agent, such as a reducing agent as described herein, for example, silane or diborane. A pre-treatment process comprises exposing the substrate to the reactive agent for more than 10 to about 60 seconds.

In one processing sequence, a first precursor is introduced into the processing chamber to form a first layer or first monolayer on the substrate surface, a first chamber purge process is performed using a purge gas, a second precursor is introduced into the processing chamber to form a second layer or second monolayer, a second chamber purge process is performed using a purge gas, a plasma gas is introduced into the chamber and a plasma is generated, and then a third chamber purge process is performed using a purge gas. For an atomic layer deposition process, the above process would comprise one cycle, and the ALD process would include between 2 and 100 cycles based on a desired thickness. The first precursor may be the metal halide precursors as described herein, and the second precursor may be one or more of the reactive/reducing compounds described herein.

An example of this processing sequence, includes introducing a hafnium tetrachloride precursor to the processing chamber and a substrate disposed therein to deposit a monolayer of material, purging the processing chamber of hafnium tetrachloride precursor, introducing an aluminum precursor, such as triethylaluminum or tritertbutyl aluminum to react with the deposited material, purging the processing chamber of triethylaluminum or tritertbutyl aluminum, and providing a plasma, either in situ or remotely, of hydrogen gas plasma/radicals to reduce the deposited material to hafnium or hafnium carbide, and then purging the chamber of the hydrogen gas plasma/radicals. In some embodiments of this processing sequence, plasma may be added only if needed to further reduce contamination.

In another processing sequence, a first precursor is introduced into the processing chamber to form a first layer or first monolayer on the substrate surface, a first chamber purge process is performed using a purge gas, a plasma gas is introduced into the chamber and a plasma is generated, a second chamber purge process is performed using a purge gas, a second precursor is introduced into the processing chamber to form a second layer or second monolayer, and then a third chamber purge process is performed using a purge gas. For an atomic layer deposition (ALD) process, the above process would be one cycle, and the ALD process would include from 2 to 200 cycles based on a desired thickness. The first precursor may be the metal-halide precursors as described herein, and the second precursor may be one or more of the reactive/reducing compounds described herein.

An example of this processing sequence, includes introducing a hafnium tetrachloride precursor to the processing chamber and a substrate disposed therein to deposit a monolayer of material, purging the processing chamber of hafnium tetrachloride precursor, providing a plasma, either in situ or remotely, of hydrogen gas plasma/radicals to reduce the deposited material to hafnium or hafnium carbide, purging the chamber of the hydrogen gas plasma/radicals, introducing an aluminum precursor, such as triethylaluminum or tritertbutyl aluminum to react with the deposited material, and then purging the processing chamber of triethylaluminum or tritertbutyl aluminum.

In a third processing sequence, a first precursor is introduced into the processing chamber to form a first layer or first monolayer on the substrate surface, a first chamber purge process is performed using a purge gas, a first plasma gas is introduced into the chamber and a first plasma is generated, a second chamber purge process is performed using a purge gas, a second precursor is introduced into the processing chamber to form a second layer or second monolayer, a second plasma gas is introduced into the chamber and a second plasma is generated, and then a third chamber purge process is performed using a purge gas. For an atomic layer deposition process, the above process would be one cycle, and the ALD process would include between 2 and 100 cycles based on a desired thickness. The first precursor may be the metal halide precursors as described herein, and the second precursor may be one or more of the reactive/reducing compounds described herein.

In an additional processing sequence, a first precursor and a second precursor are co-flowed into the processing chamber to form a first layer or first monolayer on the substrate surface, a first chamber purge process is performed using a purge gas, a plasma gas is introduced into the chamber and a plasma is generated, and then a second chamber purge process is performed using a purge gas. For an atomic layer deposition process, the above process would be one cycle, and the ALD process would include between 2 and 100 cycles based on a desired thickness. The first precursor may be the metal-halide precursors as described herein, and the second precursor may be one or more of the reactive/reducing compounds described herein.

In a further processing sequence, a first precursor is introduced into the processing chamber to form a first layer or first monolayer on the substrate surface, a first chamber purge process is performed using a purge gas, a second precursor is introduced into the processing chamber and a plasma is generated to form a second layer or second monolayer, and then a second chamber purge process is performed using a purge gas. For an atomic layer deposition process, the above process would be one cycle, and the ALD process would include between 2 and 100 cycles based on a desired thickness. The first precursor may be the metal-halide precursors as described herein, and the second precursor may be one or more of the reactive/reducing compounds described herein.

In a further processing sequence, a first precursor is introduced into the processing chamber to form a first layer or first monolayer on the substrate surface, a first chamber purge process is performed using a purge gas, a second precursor is introduced into the processing chamber to form a second layer or second monolayer or reacts with the first monolayer, and then a second chamber purge process is performed using a purge gas. For an atomic layer deposition process, the above process would be one cycle, and the ALD process would include between 2 and 100 cycles based on a desired thickness. The first precursor may be the metal-halide precursors as described herein, and the second precursor may be one or more of the reactive/reducing compounds described herein. In process sequence, no plasma has been used to process the substrate.

In a further processing sequence, a first precursor is introduced into the processing chamber for a period of time and then flow is stopped. Next, a second precursor is introduced into the processing chamber for a period of time and reacts with the first precursor to form a layer on the substrate. The second precursor is then stopped. The above process sequence would be one cycle, and the process would include between 2 and 100 cycles based on a desired thickness. The first precursor may be the metal-halide precursors as described herein, and the second precursor may be one or more of the reactive/reducing compounds described herein.

In a further processing sequence, the first precursor is introduced into the processing chamber, the second precursor flows continuously into the processing chamber, and the first precursor flow is pulsed. The first precursor flowing into the chamber and then flow discontinuing would be one cycle, and the process would include between 2 and 100 cycles based on a desired thickness. The first precursor may be the metal-halide precursors as described herein, and the second precursor may be one or more of the reactive/reducing compounds described herein.

The composition of the metal-containing material, such as metal, metal carbide material, metal silicide material, metal carbide silicide material, or metal carbide nitride material may be determined during process 110 prior to the advancing to either process 112 or process 114. If the desired composition has not been obtained, method 100 proceeds to process 112 to adjust the particular process perimeters (e.g., deposition temperature and/or flow rate of the deposition gases) in order to achieve the desired composition. Alternatively, once the process perimeters are calibrated to obtain the desired composition of the metal-containing material, method 100 progresses to process 114.

During process 112, the deposition temperature, as well as the flow rate of a metal halide-containing gas and reactive gas may be adjusted in order to obtain the desired composition of the metal-containing material. Thereafter, process 108 is repeated to form the metal-containing material. The deposition temperature may be adjusted during the deposition process, such as thermal decomposition, CVD processes, or ALD processes. Adjusting the deposition temperature may alter the elemental concentrations within the metal-containing material. For example, the deposition temperature may be increased in order to lower the carbon concentration within a metal carbide material. Alternatively, the deposition temperature may be lowered in order to increase the carbon concentration within a metal carbide material. In one embodiment, the temperature of the substrate or the substrate pedestal during process 108 may be within a range from about 200° C. to about 800° C., preferably, from about 350° C. to about 550° C., and more preferably, from about 400° C. to about 500° C. In another embodiment, the substrate may be heated to a temperature within a range from about 100° C. to about 600° C., preferably, from about 100° C. to about 500° C., and more preferably, from about 150° C. to about 500° C. Suitable temperatures for deposition using metal halide precursors described herein may be from 100° C. to about 450° C., such as from about 150° C. to about 425° C.

In another embodiment, the flow rate of the metal halide precursor gas and/or reactive gases may also be adjusted to obtain the desired composition of the metal-containing material, such as for a specific interstitial/elemental carbon atomic ratio, silicon atomic ratio, aluminum atomic ratio, or nitrogen atomic ratio. The atomic ratios will vary depending on the metal in the halide precursor and the work function properties desired. The flow rate of the reactive gases may each be adjusted to about 4,000 sccm or less, such as within a range from about 100 sccm to about 4,000 sccm, preferably, from about 300 sccm to about 3,000 sccm, and more preferably, from about 1,000 sccm to about 2,000 sccm. Alternatively, the reactive gases may have a flow rate within a range from about 50 sccm to about 2,000 sccm, preferably, from about 100 sccm to about 1,500 sccm. In various examples, the reducing gas may have a flow rate of about 100 sccm, 500 sccm, 1,000 sccm or 1,500 sccm. The flow rate of carrier gas of the metal halide precursor gas may be adjusted to about 1,000 sccm or less, such as within a range from about 50 sccm to about 2,000 sccm, preferably, from about 100 sccm to about 1,000 sccm, and more preferably, from about 300 sccm to about 700 sccm. If the reactive gas is also a precursor gas, such as the aluminum precursors, then it will also have a carrier gas flow rate.

The flow rates of the reactive gases relative to the flow rate of the metal halide precursor gas may have a gaseous flow rate ratio of about 1:1, 2:1, 3:1, 4:1, 5:1, or higher. Adjusting the flow rates of the gases, and thus the flow rate ratios, may alter the elemental concentrations within the metal-containing material. For example, the gaseous flow rate ratio may be increased in order to lower the carbon concentration within a metal carbide material. Alternatively, the gaseous flow rate ratio may be lowered in order to increase the carbon concentration within a metal carbide material.

At process 114, if the desired thickness of the metal or metal-containing material is not achieved, then the method proceeds back to process 108. Method 100 is stopped once the desired thickness of metal-containing material has been formed on the substrate. The overall thickness of the metal-containing material is dependent on the specific requirements of the fabrication application. For example, the metal, metal carbide, metal silicide, metal carbide silicide, or metal carbide nitride material may be deposited to form a metal-containing gate electrode that has a thickness within a range from about 10 Å to about 1,000 Å, preferably, from about 40 Å to about 200 Å. In another example, the metal, metal carbide, metal silicide, metal carbide silicide, or metal carbide nitride may be deposited to form a metal-containing barrier layer that has a thickness within a range from about 3 Å to about 200 Å, preferably, from about 5 Å to about 100 Å, and more preferably, from about 10 Å to about 50 Å.

In an example of one process, tantalum carbide, hafnium carbide, or hafnium silicide, may be deposited as a work function metal in the structures described herein. N-metal gate types for NMOS structures, such as tantalum carbide, hafnium carbide, or and hafnium silicide, may exhibit work functions of less than 4.3 eV. Tantalum carbide, hafnium carbide, or hafnium silicide may be further doped with carbon or silicon, if not already present, to an amount that allows the doped material to exhibit a work function of less than 4.4 eV. P-metal gate types for PMOS structures, such as metal carbide nitrides, may exhibit work functions of between 5.0-5.1 eV. The presence of the dopants of carbon, silicon, or nitrogen (or other additive materials described herein) allows for modifying the work function value to provide a desired work function value for a desired application. Other atoms may be present, such as halides in the deposited carbide and silicides, and still provide an effective work function value.

In one embodiment, the deposited metal carbide material may have the chemical formula of $MC_x$, wherein x is within a range from about 0.5 to about 2. The deposited metal carbide material may have an interstitial/elemental carbon atomic ratio of about 2:1 or greater, such as from about 3:1 to about 5:1. In another embodiment, the deposited metal silicide material may have the chemical formula $MSi_x$, wherein x is within a range from about 0.05 to about 2. The metal, metal carbide, metal silicide, metal carbide silicide, or metal boride layer may have a work function of less than 4.3 eV, such as from 3.5 eV to less than 4.3 eV, for example, from 4.1 eV to less than 4.3 eV. The metal, metal carbide, metal silicide, metal carbide silicide, or metal boride layer may also have a resistivity from 2.5 μΩ-cm to less than 1,000 μΩ-cm, for example about 500 μΩ-cm, or such as from 50 to less than 200 μΩ-cm, for example, about 150 μΩ-cm. If the work function resistivity is low, then the work function metal may be used also as a fill material. In such instances, the work function metal resistivity may be less than 100 μΩ-cm. In one embodiment, the metal, metal carbide, metal silicide, or metal carbide silicide layer may be deposited having a crystalline structure or an amorphous structure. If the metal, metal carbide, metal silicide, or metal carbide silicide layer is used as a barrier material, such as with a work function material in a NMOS structure, such as shown in FIG. 3B, the material is preferably deposited as an amorphous material.

In a crystalline structure, the two forms of carbon are incorporated within the metal or metal carbide material. The crystalline metal or metal carbide may have interstitial carbon, which is covalently bonded to the metal and nitrogen atoms, and is interstitially positioned within the lattice sites of the crystalline structure. The crystalline metal or metal carbide may also have elemental carbon, which is physically incorporated (not covalently bonded) to metal and nitrogen atoms, and is positioned outside of the lattice sites of the crystalline structure.

Also, the carbon and nitrogen concentrations may be varied so that the metal or metal carbide material has a sheet resistance within a range from about $1 \times 10^4$ Ω/sq to about $1 \times 10^6$ Ω/sq.

Figure 2A:
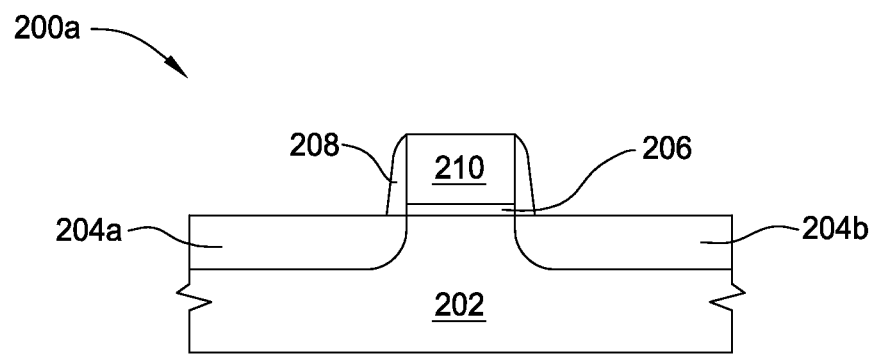
FIGS. 2A-2B depict cross-sectional views of substrates containing metal carbide materials used as gate electrodes in accordance with embodiments described herein.

In addition to the embodiment shown in FIG. 3B, other structures may include metal-containing materials deposited according to embodiments of the invention described herein. In one embodiment, FIG. 2A depicts metal-containing gate electrode 210 containing a metal, metal carbide, metal silicide, metal carbide silicide, or metal carbide nitride material deposited by methods described herein on substrate 200a, which may be used in a Logic application. Substrate 200a contains source layer 204a and drain layer 204b deposited or formed on layer 202, which may be the substrate surface or a dielectric layer disposed thereon. In one example, source layer 204a and drain layer 204b may be formed by implanting ions into layer 202. The segments of source layer 204a and drain layer 204b are bridged by metal-containing gate electrode 210 formed on gate insulting layer 206. An off-set layer or spacer 208 may be deposited on both sides of metal-containing gate electrode 210. Gate insulting layer 206 may contain a dielectric material such as hafnium oxide, hafnium silicate, hafnium silicon oxynitride, aluminates thereof, or derivatives thereof. Spacer 208 may contain silicon nitride, silicon oxynitride, derivatives thereof, or combinations thereof.

Figure 2B:
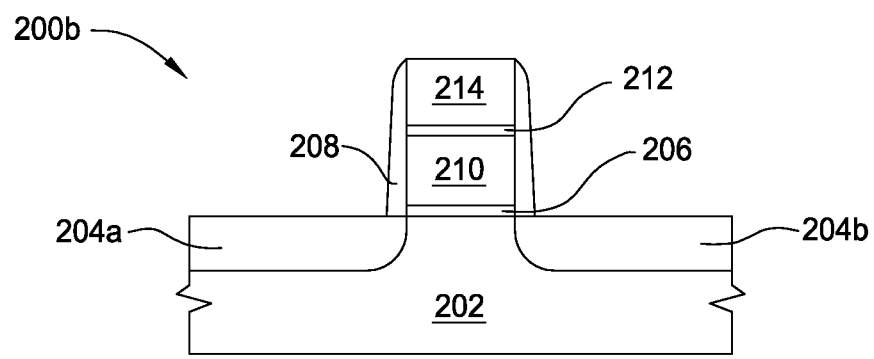

In another embodiment, FIG. 2B depicts metal-containing gate electrode 210 containing a metal, metal carbide, metal silicide, metal carbide silicide, or metal carbide nitride material deposited by methods described herein on substrate 200b, which may be used in a Flash application. Substrate 200b may share most of the features as substrate 200a, but also contains metal-containing gate electrode 214, a gate control layer, deposited on isolation layer 212 which is disposed on metal-containing gate electrode 210. Metal-containing gate electrode 214 may contain a metal, metal carbide, metal silicide, metal carbide silicide, or metal carbide nitride material deposited by methods described herein. Isolation layer 212 may contain an oxynitride, such as an oxide-nitride (ON) layered material or an oxide-nitride-oxide (ONO) layered material, a silicon nitride (SiN) layered material, or a silicide, such as metal silicide.

The metal, metal carbide, metal silicide, metal carbide silicide, or metal carbide nitride material contained within metal-containing gate electrodes 210 or 214 may be formed or deposited by a thermal decomposition process, a CVD process, a pulsed-CVD process, a PE-CVD process, an ALD process, a PE-ALD process, or derivatives thereof, using the metal halide precursors described herein. The metal, metal carbide, metal silicide, metal carbide silicide, or metal carbide nitride material may be deposited to form metal-containing gate electrodes 210 or 214 having a thickness within a range from about 10 Å to about 1,000 Å, such as from about 40 Å to about 200 Å. In another embodiment, the thickness may be within a range from about 10 Å to about 300 Å, such as from about 25 Å to about 70 Å.

Metal-containing gate electrodes 210 or 214 may each have a varied composition to better control the work function, such as the work function of metal-containing gate electrode 210 between source layer 204a and drain layer. Metal-containing gate electrodes 210 and 214 may contain metal and optionally may contain carbon, nitrogen silicon, aluminum, boron, phosphorus, or combinations thereof. In many examples, metal-containing gate electrodes 210 or 214 may have a sheet resistance within a range from about $1 \times 10^4$ Ω/sq to about $1 \times 10^6$ Ω/sq. However, the work function of metal-containing gate electrodes 210 or 214 may be adjusted to be less resistive by increasing a material concentration, such as nitrogen, and/or decreasing the carbon concentration relative to the metal concentration. In one example, metal-containing gate electrodes 210 or 214 contains metal carbide with a sheet resistance of greater than about $1 \times 10^5$ Ω/sq, preferably, about $1 \times 10^6$ Ω/sq or greater. Alternatively, the work function of metal-containing gate electrodes 210 or 214 may be adjusted to be more resistive by decreasing a material concentration, such as nitrogen, and/or increasing the carbon concentration relative to the metal concentration. In another example, metal-containing gate electrodes 210 or 214 has a sheet resistance of less than about $1 \times 10^5$ Ω/sq, such as about $1 \times 10^4$ Ω/sq or less.

Figure 3A:
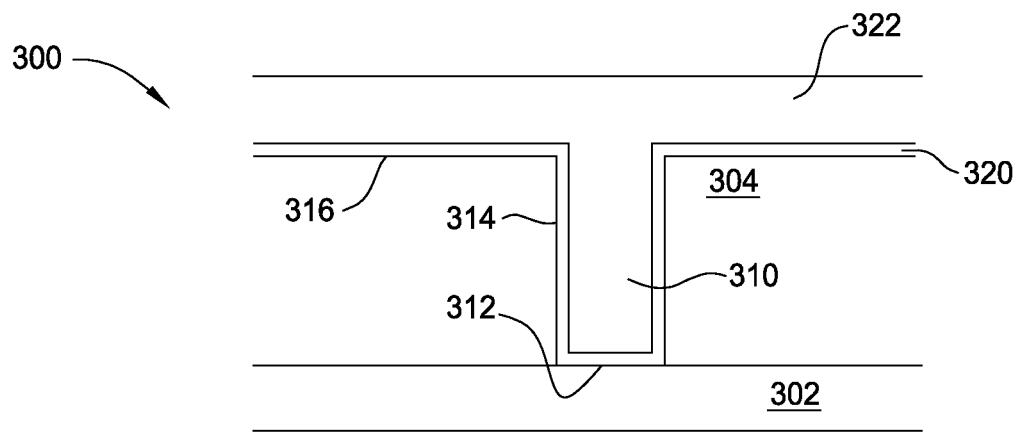
FIG. 3A depicts a cross-sectional view of another substrate containing a metal carbide used as a barrier layer in accordance with other embodiments described herein.
Figure 3B:
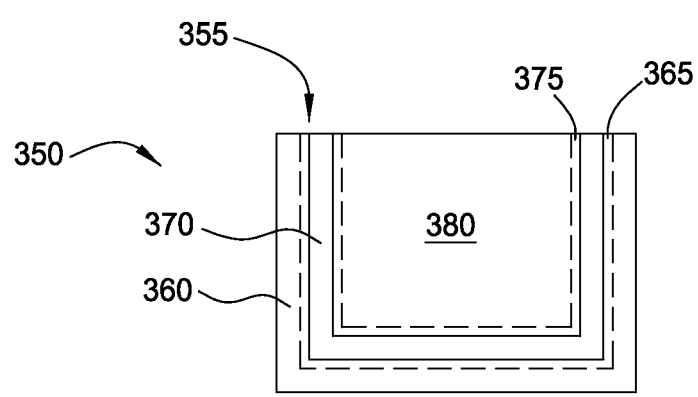
FIG. 3B depicts a cross-sectional view of a substrate containing metal carbide materials used as a conformal gate electrodes in accordance with embodiments described herein.

In another embodiment, FIG. 3A depicts substrate 300 having an exemplary structure upon which metal, metal carbide, metal silicide, metal carbide silicide, or metal carbide nitride material may be deposited as metal-containing barrier layer 320. Substrate 300 contains lower layer 302 that may be one or more layers and dielectric layer 304 disposed thereon. Via 310 may be formed within dielectric layer 304 by etching techniques or dielectric layer 304 may be deposited forming via 310. Via 310 extends through dielectric layer 304 to lower layer 302. Via 310 contains bottom surface 312 and wall surfaces 314. The field of substrate 300 extends across upper surface 316 of dielectric layer 304.

Metal-containing barrier layer 320 contains a metal, metal carbide, metal silicide, metal carbide silicide, or metal carbide nitride that may be deposited or formed on substrate 300 by employing the deposition processes described herein, such as thermal decomposition, CVD, pulsed-CVD, PE-CVD, ALD, or PE-ALD. The metal, metal carbide, metal silicide, metal carbide silicide, or metal carbide nitride may be deposited to form metal-containing barrier layer 320 having a thickness within a range from about 3 Å to about 200 Å, such as from about 5 Å to about 100 Å, or from about 10 Å to about 50 Å.

Metal-containing barrier layer 320 may be directly deposited on upper surface 316, as depicted in FIG. 3A. Alternatively, upper surface 316 may be pre-treated or have one or multiple layers deposited thereon, prior to the deposition of metal-containing barrier layer 320 (not shown). For example, an adhesion layer or a nucleation layer may be deposited between upper surface 316 and metal-containing barrier layer 320. Also, additional barrier layers, nucleation layers, or seed layers, may be deposited onto metal-containing barrier layer 320 prior to depositing metal layer 322 (not shown). An adhesion layer, a nucleation layer, a seed layer, or an additional barrier layer may contain titanium, tantalum, tungsten, cobalt, ruthenium, nitrides thereof, silicides thereof, or alloys thereof and may be formed by a deposition process such as ALD, CVD, or PVD. Metal-containing barrier layer 320 may serve as a seed layer to promote the formation of metal layer 322 using, for example, electroplating or ALD techniques. Important characteristics that metal-containing barrier layer 320 should demonstrate include good process coverage, thickness uniformity, high electrical conductivity, and ability to prohibit copper and/or aluminum diffusion.

In one example, metal-containing barrier layer 320 is formed by sequentially exposing substrate 300 to a metal precursor and at least another precursor during an ALD process. Although not required, metal-containing barrier layer 320 may contain monolayers of multiple compounds, such as metal, metal carbide, metal silicide, metal carbide silicide, or metal carbide nitride. Metal-containing barrier layer 320 conforms to the profile of via 310 so as to cover bottom surface 312 and wall surface 314, as well as across upper surface 316 of dielectric layer 304.

Metal layer 322 fills via 310 while being deposited over metal-containing barrier layer 320. Metal layer 322 may contain a conductive metal that includes copper, tungsten, aluminum, tantalum, titanium, ruthenium, silver, alloys thereof, or combinations thereof. The deposition process used to form metal layer 322 may include CVD, PVD, electroless plating, electroplating, or combinations thereof. Also, metal layer 322 may include a combination of layers made by various deposition processes, such as a seed layer formed by an ALD process and a bulk layer or fill layer by a CVD process.

In one example, metal layer 322 contains a copper-containing seed layer deposited by PVD, electroless plating, or electroplating and a copper-containing bulk layer deposited by CVD, electroless plating, or electroplating. In another example, metal layer 322 contains a ruthenium-containing seed layer deposited by ALD, PVD, electroless plating, or electroplating and a copper-containing bulk layer deposited by CVD, electroless plating, or electroplating. In another example, metal layer 322 contains a tungsten-containing seed layer deposited by ALD, CVD, or PVD and a tungsten-containing bulk layer deposited by CVD.

In other examples, metal gate applications for metal, metal carbide, metal silicide, metal carbide silicide, or metal carbide nitride may be deposited by deposition processes described herein. The gate layer may contain a gate material such as silicon oxynitride, hafnium oxide, aluminum oxide or combinations thereof. A metal, metal carbide, metal silicide, metal carbide silicide, or metal carbide nitride is deposited on the gate layer by the vapor deposition processes described herein. Generally, metal, metal carbide, metal silicide, metal carbide silicide, or metal carbide nitride is deposited on a gate layer with a thickness within a range from about 20 Å to about 200 Å, such as about 40 Å. Subsequently, a second metal-containing layer is deposited on the metal, metal carbide, metal silicide, metal carbide silicide, or metal carbide nitride. The second metal-containing layer may contain titanium, titanium nitride, tungsten, tantalum, ruthenium or combinations thereof and are deposited by CVD, ALD, PVD, electrochemical plating, or electroless plating processes.

FIG. 3B depicts a semi-conductor structure having a metal-containing gate electrode 350 containing a metal, metal carbide, metal silicide, metal carbide silicide, or metal carbide nitride deposited by methods described herein, which may be used in a Logic application. Additionally, the semi-conductor structure of FIG. 3B may be used in planar and three dimensional transistors having gate structures. Examples of three dimensional transistors having gate structures a FinFET (a nonplanar, double-gate transistor built on an silicon on insulator technology substrate, based on the earlier DELTA (single-gate) transistor design) or a Trigate transistor structure.

Figure 4:
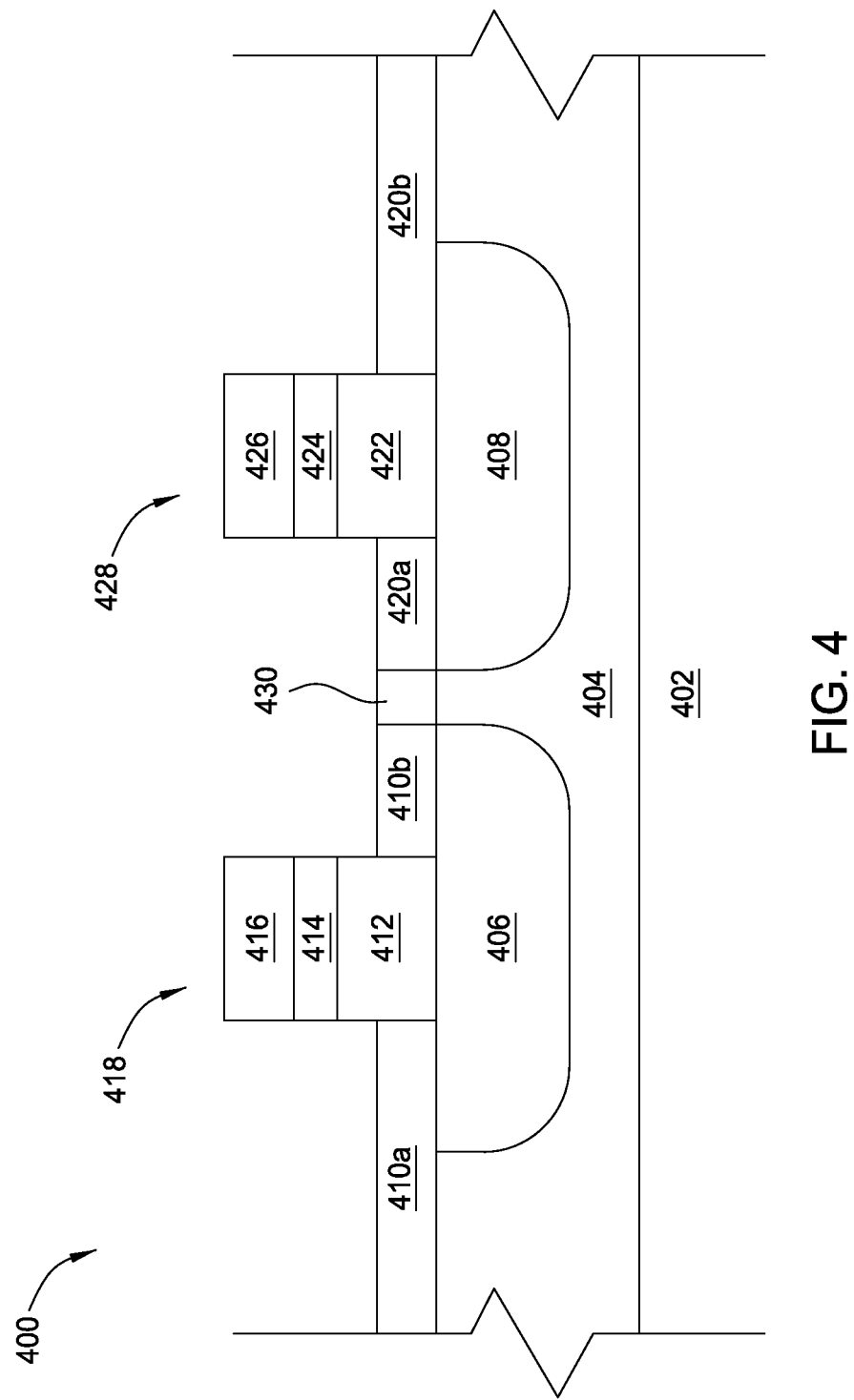
FIG. 4 is a schematic drawing of a CMOS structure having NMOS and PMOS aspects according to one embodiment of the invention.

FIG. 4 is a schematic drawing of a CMOS structure 400 according to one embodiment of the invention. The CMOS structure 400 may comprise a substrate 402 having an epitaxial layer 404 deposited thereover. Within the epitaxial layer 404, a p-well 406 and an n-well 408 may be formed. Over the p-well 406, an NMOS structure 418 may be formed. The NMOS structure 418 may comprise a source electrode 410A, a drain electrode 410B, a high k layer 412, a capping layer 414, and a gate electrode 416. Similarly, a PMOS structure 428 may be formed over the n-well 408. The PMOS structure 428 may comprise a source electrode 420A, a drain electrode 420B, a high k layer 422, a capping layer 424, and a gate electrode 426. The NMOS structure 418 may be isolated from the PMOS structure 428 by an isolation region 430.

The capping layers 414, 424 may be present between the high k layers 412, 422 and the gate electrodes 416, 426 to prevent the gate electrodes 416, 426 from reacting with the high k layers 412, 422. The capping layers 414, 424 may tune the threshold voltage. In one embodiment, the capping layer 414 in the NMOS structure 418 is different than the capping layer 424 of the PMOS structure 428. For the NMOS structure 418, the high K layer 412 may be hafnium oxide, and the gate electrode 416 may comprise a metal or metal carbide as described herein.

A detailed description for ALD processes and ALD deposition chambers that may be used with the deposition process described herein, are further described in commonly assigned U.S. Pat. No. 6,916,398, and U.S. Ser. No. 10/281,079, filed Oct. 25, 2002, and published as US 2003-0121608 and in commonly assigned U.S. Pat. No. 6,998,014, as well as U.S. Ser. No. 11/556,745, filed Nov. 6, 2006, and published as U.S. Pub. No. 2007-0119370, and U.S. Ser. No. 11/556,763, filed Nov. 6, 2006, and published as U.S. Pub. No. 2007-0128864. A detailed description for a vaporizer or an ampoule to preheat precursors is described in commonly assigned U.S. Pat. Nos. 6,905,541, 6,915,592, and 7,186,385, as well as U.S. Ser. No. 10/590,448, filed Aug. 24, 2006, and published as U.S. Pub. No. 2007-0067609, and U.S. Ser. No. 11/246,890, filed Oct. 7, 2005, and published as U.S. Pub. No. 2007-0079759. A detailed description for a system to deliver the precursors to a process chamber is described in commonly assigned U.S. Pat. No. 6,955,211, and U.S. Ser. No. 10/700,328, filed Nov. 3, 2003, and published as U.S. Pub. No. 2005-0095859.

"Substrate surface" or "substrate," as used herein, refers to any substrate or material surface formed on a substrate upon which film processing is performed during a fabrication process. For example, a substrate surface on which processing may be performed include materials such as monocrystalline, polycrystalline or amorphous silicon, strained silicon, silicon on insulator (SOI), doped silicon, silicon germanium, germanium, gallium arsenide, glass, sapphire, silicon oxide, silicon nitride, silicon oxynitride, and/or carbon doped silicon oxides, such as $SiO_xC_y$, for example, BLACK DIAMOND® low-k dielectric, available from Applied Materials, Inc., located in Santa Clara, Calif. Substrates may have various dimensions, such as 200 mm or 300 mm diameter wafers, as well as, rectangular or square panes. Unless otherwise noted, embodiments and examples described herein are conducted on substrates with a 200 mm diameter or a 300 mm diameter.

Embodiments of the processes described herein may be utilized to deposit metal carbide nitride materials, metal nitride materials, derivatives thereof, alloys thereof, and other metal-containing materials on many substrates and surfaces. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, and patterned or non-patterned wafers. Substrates may be exposed to a pretreatment process to polish, etch, reduce, oxidize, hydroxylate, anneal, and/or bake the substrate surface.

EXAMPLES

Metal-containing materials, such as the metal carbide materials described herein, may be formed by the variety of deposition processes in the following actual and hypothetical Examples. The deposition of the metal carbide materials, layers, or films may be used for metal gate electrodes, barrier layers, adhesion layers, and as other components used in various Logic, Flash, and DRAM applications, as well as in contact application.

The metal precursors, such as a tantalum halide precursor ($TaF_5$ and/or $TaCl_5$), may be heated in a vaporizer, a bubbler or an ampoule prior to flowing into the deposition chamber. The metal precursor may be heated to a temperature of at least about 50° C., such as at least about 60° C., more preferably, from about 60° C. to about 85° C., for example about 65° C. The preheated metal precursor is retained in the carrier gas more thoroughly than if the metal precursor was at room temperature. An exemplary substrate temperature or substrate pedestal during the deposition process is within a range from about 200° C. to about 800° C., preferably, from about 350° C. to about 550° C., and more preferably, from about 400° C. to about 500° C. The deposition chamber regional varies, but has a similar temperature to that of the substrate temperature. The deposition chamber has a controlled environment that is pressurized within a range from about 1 mTorr to about 100 Torr, preferably, from about 1 Torr to about 10 Torr, and more preferably, from about 2 Torr to about 5 Torr. In other examples, it should be understood that other temperatures and pressures may be used during the process described herein.

Example 1

PE-ALD

A tantalum layer may be deposited on a substrate by a PE-ALD process. The substrate and the substrate pedestal were heated to a temperature of about 250° C. The substrate was sequentially exposed to a tantalum halide precursor, $TaF_5$, an argon purge gas, a hydrogen plasma gas and a plasma is generated, and the argon purge gas during a PE-ALD cycle. The PE-ALD cycle exposed the substrate to the tantalum precursor gas for about 5 seconds, and the purge gas for about 2 seconds, and a hydrogen gas in which a plasma was generated at 400 watts and exposed the substrate for 10 seconds. The tantalum precursor gas had a flow rate of about 3 sccm of $TaF_5$ in about 250 sccm of argon carrier gas. The tantalum material was deposited on the substrate to a final thickness of about 10 Å by 20 cycles of about 0.5 Å with each cycle lasting about 20 seconds.

The composition analysis of the tantalum material provided a resistivity of less than 200 μΩ-cm, such as from 130 μΩ-cm to less than 200 μΩ-cm for 100 Å average layer thickness after about a 20 second plasma exposure. The deposited layer was observed to have a density of greater than 15.5/$cm^3$, a beta phase tantalum structure, and less than 5% oxygen atomic weight and less than 1% fluorine atomic weight. In some areas, a resistivity of less than 100 μΩ-cm, which may be considered pure tantalum, was observed for some 100 Å average layer thickness areas.

Example 2

ALD

A hafnium aluminide carbide layer may be deposited on a substrate by an ALD process. The substrate and the substrate pedestal were heated to a temperature of about 500° C. The substrate was sequentially exposed to a hafnium halide precursor, $HfCl_4$, a nitrogen purge gas, an aluminum precursor, triethylaluminum (TEA), tritertbutyl aluminum (TTBA), and/or trimethylaluminum (TMA) and a second nitrogen gas purge during an ALD cycle. The ALD cycle exposed the substrate to the hafnium precursor gas for about 10 seconds, a nitrogen gas purge for 10 seconds, exposed the substrate to TEA and/or TTBA for 5 seconds, and then a nitrogen gas purge for 5 seconds. The hafnium precursor gas had a flow rate of about 2 sccm of $HfCl_4$ in about 250 sccm of argon carrier gas. The TEA and/or TTBA precursor had a flow rate of about 30 mg/minute. The hafnium alumunide material was deposited on the substrate to a final thickness of about 2 to 3 Å by 100 cycles of about 200 to about 300 Å with each cycle lasting about 20 seconds. The composition analysis of the hafnium carbide material provided a resistivity of less than 1,000 μΩ-cm, such as between 800 to 900 μΩ-cm for 100 Å average layer thickness. The deposited layer was observed to have a hafnium atomic percent of about 35 at %, about 15 at % of aluminum, about 45 at % of carbon, and about 5 at % of oxygen.

Example 3

PE-ALD

A hafnium aluminide layer may be deposited on a substrate by an ALD process. The substrate and the substrate pedestal were heated to a temperature of about 500° C. The substrate was sequentially exposed to a hafnium halide precursor, $HfCl_4$, a nitrogen purge gas, an aluminum precursor, triethylaluminum (TEA) and/or tritertbutyl aluminum (TTBA), and a second nitrogen gas purge, during an ALD cycle, and a plasma of hydrogen after one or more of the ALD cycles. The ALD cycle exposed the substrate to the hafnium precursor gas for about 10 seconds, a nitrogen gas purge for 10 seconds, exposed the substrate to TEA and/or TTBA for 5 seconds, and then a nitrogen gas purge for 5 seconds. The hafnium precursor gas had a flow rate of about 2 sccm of $HfCl_4$ in about 250 sccm of argon carrier gas. The aluminum precursor had a flow rate of about 30 mg/minute. The plasma gas was introduced at a flow rate of 2000 sccm and a plasma generated for about 10 seconds.

Example 4

PE-ALD

A hafnium aluminide layer may be deposited on a substrate by an ALD process. The substrate and the substrate pedestal were heated to a temperature of about 500° C. The substrate was sequentially exposed to a hafnium halide precursor, $HfCl_4$, a nitrogen purge gas, a plasma process, an aluminum precursor, triethylaluminum (TEA) and/or tritertbutyl aluminum (TTBA), and a second nitrogen gas purge, during an ALD cycle. The ALD cycle exposed the substrate to the hafnium precursor gas for about 10 seconds, a nitrogen gas purge for 10 seconds, exposed the substrate to a hydrogen plasma for about 5 seconds, exposed the substrate to the aluminum precursor for 5 seconds, and then perform a nitrogen gas purge for 5 seconds. The hafnium precursor gas had a flow rate of about 2 sccm of $HfCl_4$ in about 250 sccm of argon carrier gas. The aluminum precursor had a flow rate of about 30 mg/minute. The plasma gas was introduced at a flow rate of 2000 sccm and a plasma generated for about 10 seconds.

Example 5

ALD

A tantalum carbide layer may be deposited on a substrate by an ALD process. The substrate and the substrate pedestal were heated to a temperature of about 550° C. The substrate was sequentially exposed to a tantalum halide precursor, $TaCl_5$, a nitrogen purge gas, an ethylene precursor, and a second nitrogen gas purge during 100 ALD cycles. The ALD cycle exposed the substrate to the tantalum precursor gas for about 5 seconds, a nitrogen gas purge for 2 seconds, exposed the substrate to ethylene for 5 seconds, and then a nitrogen gas purge for 2 seconds. The tantalum precursor gas had a flow rate of about 2 sccm of $TaCl_5$ in about 250 sccm of argon carrier gas. The ethylene precursor had a flow rate of about 1000 sccm. It is believed that the ethylene reacts with the $TaCl_5$ to form $C_2H_4Cl_2$, which is pumped away, leaving behind a TaC film. The tantalum carbide material was deposited on the substrate to a final thickness of about 100 Å by 100 cycles of less than about 1 Å with each cycle lasting about 14 seconds. The ratio of Ta/C was about 0.90.

Example 6

Pulsed CVD

A tantalum carbide layer may be deposited on a substrate by a pulsed chemical vapor deposition process. The substrate was sequentially exposed to a tantalum halide precursor, $TaCl_5$, a nitrogen purge gas, an ethylene precursor, and a second nitrogen gas purge during 100 cycles.

Example 7

ALD

A tantalum silicide layer may be deposited on a substrate by a pulsed chemical vapor deposition process. The substrate was sequentially exposed to a tantalum halide precursor, $TaCl_5$, a nitrogen purge gas, a silane precursor and/or disilane, and a second nitrogen gas purge during 100 ALD cycles. The substrate and the substrate pedestal were heated to a temperature of about 425° C. It is believed that the silane reacts with the $TaCl_5$ to form $Si_2H_2Cl_2$ or HCl, which is subsequently pumped away, leaving behind a TaSi film. The tantalum silicide film formed has a Ta/Si ratio of 1.75. In a similar embodiment, by reducing the temperature to about 350° C., the Ta/Si ratio was 0.90.

Example 8

ALD

A tantalum carbide aluminide layer may be deposited on a substrate by a pulsed chemical vapor deposition process. The substrate was sequentially exposed to a tantalum halide precursor, $TaCl_5$, a nitrogen purge gas, an aluminum precursor, triethylaluminum (TEA), and a second nitrogen gas purge during 100 ALD cycles. It is believed that the TEA reacts with the $TaCl_5$ to form an aluminum alkyl chloride which is subsequently pumped away, leaving behind a $TaC_xAl_y$ film. The substrate and the substrate pedestal were heated to a temperature of about 300° C. The tantalum carbide aluminide film formed has a Ta/C ratio of about 1.00. The deposited layer was observed to have a tantalum atomic percent of about 37.60 at %, about 15.50 at % of aluminum, and about 37.50 at % of carbon.

In a similar embodiment, by increasing the temperature to about 350° C., the Ta/C ratio was about 0.90. At the 350° C. deposition temperature, the deposited tantalum carbide aluminide film was observed to have a tantalum atomic percent of about 36.35 at %, about 17.80 at % of aluminum, and about 40.25 at % of carbon.

By increasing the temperature again, this time to about 400° C., the Ta/C ratio was about 0.79. At the 400° C. deposition temperature, the deposited layer was observed to have a tantalum atomic percent of about 33.30 at %, about 22.30 at % of aluminum, and about 42.30 at % of carbon.

Although the invention has been described in terms of specific embodiments, one skilled in the art will recognize that various changes to the reaction conditions, e.g., temperature, pressure, film thickness and the like can be substituted and are meant to be included herein and sequence of gases being deposited. For example, sequential deposition process may have different initial sequence. The initial sequence may include exposing the substrate to the nitrogen-containing gas before the tantalum precursor gas is introduced into the processing chamber. In addition, the tantalum carbide nitride layer may be employed for other features of circuits in addition to functioning as a diffusion barrier for contacts. Therefore, the scope of the invention should not be based upon the foregoing description. Rather, the scope of the invention should be determined based upon the claims recited herein, including the full scope of equivalents thereof.

While the foregoing is directed to embodiments of the invention, other and further embodiments of the invention may be devised without departing from the basic scope thereof, and the scope thereof is determined by the claims that follow.

What is claimed is:

1. A method for processing a substrate, comprising:
depositing a dielectric material;
depositing a work function material on the dielectric material; and
depositing a metal gate material on the work function material, wherein the work function material is tantalum silicide deposited by reacting at least one metal-halide precursor having the formula $MX_y$ with silane precursor, wherein M is tantalum, X is selected from the group of fluorine, chlorine, bromine, or iodine, and y is from 3 to 5.

2. The method of claim 1, wherein the metal gate material is tungsten.

3. The method of claim 1, wherein M is tantalum.

4. The method of claim 2, wherein X is fluorine.

5. The method of claim 1, wherein the work function material is deposited conformally on a feature formed in the dielectric material.

6. The method of claim 1, wherein the dielectric material has a dielectric constant greater than 10.

7. The method of claim 1, wherein the work function material is deposited by a plasma-enhanced deposition process.

8. The method of claim 1, wherein depositing the work function material comprises one or more sequential cycles of:
introducing a metal halide precursor into a processing chamber to form a first layer on the substrate;
purging the metal halide precursor using a purge gas;
introducing a nitrogen free reactive gas including the silane precursor into the processing chamber to form a second layer on the first layer; and purging the nitrogen-free reactive gas using the purge gas.

9. A method for processing a substrate, comprising:
forming a feature in a dielectric material on a substrate; and
depositing a work function material on the feature by:
introducing a first precursor into a processing chamber, the first precursor having a formula $MX_y$, wherein M is tantalum, X is at least one of fluorine, chlorine, bromine, and iodine, and Y is from 3 to 5, introducing a first purge gas into the processing chamber after introducing the first precursor, and introducing a nitrogen-free reactive gas comprising a silane precursor into the processing after introducing the first purge gas.

10. The method of claim 9, wherein the first precursor is tantalum pentachloride and the nitrogen-free reactive gas is a silane precursor.

11. The method of claim 9, wherein the nitrogen-free reactive gas does not contain carbon.

12. A method for processing a substrate, comprising:
depositing a dielectric material having a dielectric constant greater than 10;
forming a feature in the dielectric material;
depositing a work function material conformally on the feature in the dielectric material; and
depositing a metal gate material on the work function material, wherein the work function material is tantalum silicide deposited by reacting at least one metal-halide precursor having the formula $MX_y$, wherein M is tantalum, X is selected from the group of fluorine, chlorine, bromine, or iodine, and y is from 3 to 5.

13. The method of claim 12, wherein the metal gate material is tungsten.

14. The method of claim 12, wherein depositing the work function material includes an atomic layer deposition process.

15. The method of claim 12, wherein the work function material is deposited by a plasma-enhanced deposition process.

16. The method of claim 12, wherein depositing the work function material comprises one or more sequential cycles of:
introducing a metal halide precursor into a processing chamber to form a first layer on the substrate;
purging the metal halide precursor using a purge gas;
introducing a nitrogen free reactive gas into the processing chamber to form a second layer on the first layer; and
purging the nitrogen-free reactive gas using the purge gas.

17. The method of claim 1, wherein the at least one metal-halide precursor is reacted with a hydrogen gas.

18. The method of claim 9, wherein the nitrogen-free reactive gas does not contain a metal.

* * * * *

UNITED STATES PATENT AND TRADEMARK OFFICE
CERTIFICATE OF CORRECTION

| | | |
|---|---|---|
| PATENT NO. | : 9,048,183 B2 | Page 1 of 2 |
| APPLICATION NO. | : 14/147291 | |
| DATED | : June 2, 2015 | |
| INVENTOR(S) | : Ganguli et al. | |

It is certified that error appears in the above-identified patent and that said Letters Patent is hereby corrected as shown below:

On the Title Page:

Under abstract "18 Claims, 4 Drawing Sheets" should read -- 17 Claims, 4 Drawing Sheets --. (See Attached Sheet)

In the Claims:

Column 22, Claim 1, Line 67, please insert -- a -- after with;

Column 23, Claim 3, Line 6, please delete "The method of claim 1, wherein M is tantalum." and change status identifier to cancelled.

Signed and Sealed this
First Day of March, 2016

Michelle K. Lee
*Director of the United States Patent and Trademark Office*

(12) United States Patent
Ganguli et al.

(10) Patent No.: US 9,048,183 B2
(45) Date of Patent: Jun. 2, 2015

(54) NMOS METAL GATE MATERIALS, MANUFACTURING METHODS, AND EQUIPMENT USING CVD AND ALD PROCESSES WITH METAL BASED PRECURSORS

(71) Applicant: Applied Materials, Inc., Santa Clara, CA (US)

(72) Inventors: Seshadri Ganguli, Sunnyvale, CA (US); Srinivas Gandikota, Santa Clara, CA (US); Yu Lei, Belmont, CA (US); Xinliang Lu, Fremont, CA (US); Sang Ho Yu, Cupertino, CA (US); Hoon Kim, Santa Clara, CA (US); Paul F. Ma, Santa Clara, CA (US); Mei Chang, Saratoga, CA (US); Maitreyee Mahajani, Saratoga, CA (US); Patricia M. Liu, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/147,291

(22) Filed: Jan. 3, 2014

(65) Prior Publication Data
US 2014/0120712 A1 May 1, 2014

Related U.S. Application Data

(63) Continuation of application No. 13/093,710, filed on Apr. 25, 2011, now Pat. No. 8,642,468.

(60) Provisional application No. 61/327,995, filed on Apr. 26, 2010.

(51) Int. Cl.
H01L 21/3205 (2006.01)
H01L 21/28 (2006.01)
(Continued)

(52) U.S. Cl.
CPC ...... *H01L 21/28008* (2013.01); *C23C 16/06* (2013.01); *C23C 16/32* (2013.01);
(Continued)

(58) Field of Classification Search
None
See application file for complete search history.

(56) References Cited

U.S. PATENT DOCUMENTS 5,055,280 A 10/1991 Nakatani et al.
6,139,922 A 10/2000 Kaloyeros et al.
(Continued)

FOREIGN PATENT DOCUMENTS

KR 20030009093 A 1/2003

OTHER PUBLICATIONS

International Search Report PCT/US2011/033820 dated Jan. 5, 2012
(Continued)

*Primary Examiner* — Yasser A Abdelaziez
(74) *Attorney, Agent, or Firm* — Patterson & Sheridan, LLP

(57) ABSTRACT

Embodiments provide methods for depositing metal-containing materials. The methods include deposition processes that form metal, metal carbide, metal silicide, metal nitride, and metal carbide derivatives by a vapor deposition process, including thermal decomposition, CVD, pulsed-CVD, or ALD. A method for processing a substrate is provided which includes depositing a dielectric material forming a feature definition in the dielectric material, depositing a work function material conformally on the sidewalls and bottom of the feature definition, and depositing a metal gate fill material on the work function material to fill the feature definition, wherein the work function material is deposited by reacting at least one metal-halide precursor having the formula $MX_y$, wherein M is tantalum, hafnium, titanium, and lanthanum, X is a halide selected from the group of fluorine, chlorine, bromine, or iodine, and y is from 3 to 5.

17 Claims, 4 Drawing Sheets